(12) United States Patent
Song et al.

(10) Patent No.: US 8,090,059 B1
(45) Date of Patent: Jan. 3, 2012

(54) MULTI-VITERBI RECEIVE CHANNEL DECODER

(75) Inventors: Hongwei Song, Longmont, CO (US); Zining Wu, Los Altos, CA (US); Shaohua Yang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1262 days.

(21) Appl. No.: 11/799,488

(22) Filed: May 1, 2007

Related U.S. Application Data

(60) Provisional application No. 60/796,447, filed on May 1, 2006.

(51) Int. Cl.
*H03D 1/00* (2006.01)
*H04L 27/06* (2006.01)

(52) U.S. Cl. ......... 375/341; 375/343; 375/348; 375/265

(58) Field of Classification Search .................. 375/341, 375/232, 233, 350
See application file for complete search history.

(56) References Cited

U.S. PATENT DOCUMENTS

| | | | | |
|---|---|---|---|---|
| 4,631,735 | A | * | 12/1986 | Qureshi ........................ 375/254 |
| 4,641,327 | A | * | 2/1987 | Wei ............................... 375/365 |
| 6,097,769 | A | * | 8/2000 | Sayiner et al. ............... 375/341 |
| 6,690,750 | B1 | * | 2/2004 | Hocevar et al. ............. 375/341 |
| 7,050,513 | B1 | * | 5/2006 | Yakhnich ..................... 375/341 |
| 7,573,665 | B2 | * | 8/2009 | Eleftheriou et al. ........... 360/39 |
| 2002/0168033 | A1 | * | 11/2002 | Suzuki et al. ................. 375/341 |

OTHER PUBLICATIONS

ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.

IEEE Std 802.11a-1999 (Supplement to IEEE Std 802.11-1999) [Adopted by ISO/IEC and redesignated as ISO/IEC 8802-11: 1999/Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.

IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.

(Continued)

*Primary Examiner* — Khanh C Tran
*Assistant Examiner* — Qutbuddin Ghulamali

(57) ABSTRACT

A detector includes Viterbi detectors. A first Viterbi detector generates a preliminary decision signal. A second Viterbi detector generates a final decision signal based on an input data signal and the preliminary decision signal. The second Viterbi detector is arranged in series with the first Viterbi detector.

44 Claims, 8 Drawing Sheets

OTHER PUBLICATIONS

IEEE Std 802.11b-1999/Cor 1-2001 (Corrigendum to IEEE Std 802.11-1999); IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 2: Higher-Speed Physical Layer (PHY) extension in the 2.4 GHz Band—Corrigendum 1; LAN/MAN Standards Committee of the IEEE Computer Society; Nov. 7, 2001; 23 pages.

IEEE P802.11g/D8.2, Apr. 2003 (Supplement to ANSI/IEEE Std 802.11-1999(Reaff 2003)); Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; 69 pages.

IEEE Std 802.11h-2003 (Amendment to IEEE Std 802.11, 1999 Edition (Reaff 2003)); as amended by IEEE Stds 802.11a-1999, 802.11b-1999, 802.11b-1999/Cor 1-2001, 802.11d-2001, and 802.11g-2003; IEEE Standard for Information technology—Telecommunications and information exchange between systems—Local and metropolitan area networks—Specific requirements—Part 11: Wireless LAN Medium Access Control (MAC) and Physical Layer (PHY) specifications Amendment 5: Spectrum and Transmit Power Management Extensions in the 5 GHz band in Europe; IEEE Computer Society LAN/MAN Standards Committee; Oct. 14, 2003; 74 pages.

802.11n; IEEE P802.11-04/0889r6; Wireless LANs, TGn Sync Proposal Technical Specification; 131 pages.

IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.

IEEE 802.20-PD-06, IEEE p. 802.20 V14, Jul. 16, 2004, Draft 802.20 Permanent Document, System Requirements for IEEE 802.20 Mobile Broadband Wireless Access Systems—Version 14, 23 pages.

* cited by examiner

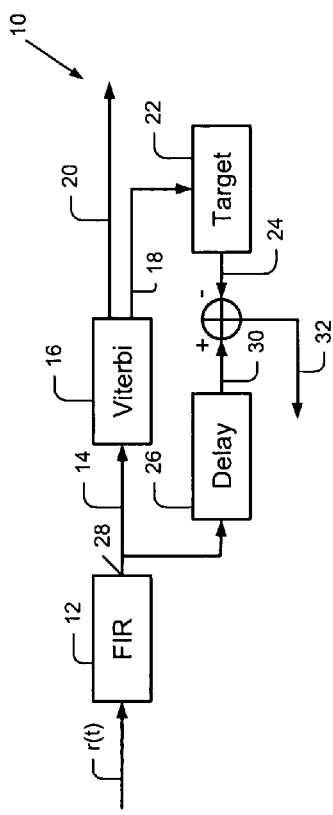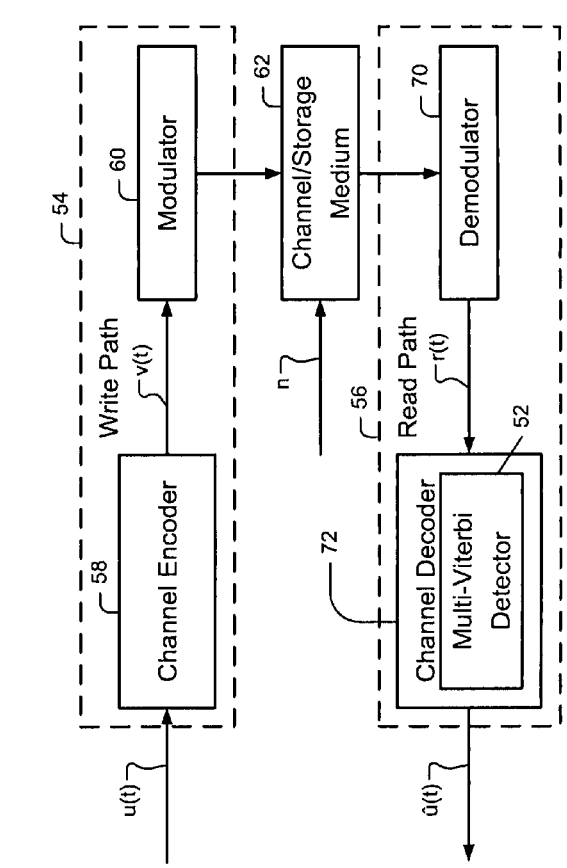

MULTI-VITERBI RECEIVE CHANNEL DECODER

CROSS-REFERENCE TO RELATED APPLICATIONS

This application claims the benefit of U.S. Provisional Application No. 60/796,447, filed on May 1, 2006. The disclosure of the above application is incorporated herein by reference in its entirety.

FIELD

The present disclosure relates to receive channel detection architectures, and more particularly to performance of and noise cancellation within a receive channel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Perpendicular magnetic recording (PMR) is a desired technology for hard disk drive storage due to its associated high storage densities. PMR refers to the vertical alignment of data bits on a recording medium, such as a disk. This vertical alignment provides additional space on the storage medium, thereby enabling higher recording densities. To decode the stored data on the storage medium, a trellis-based Viterbi detector is often coupled to an associated read channel and has certain performance limitations.

Referring to FIG. 1, a traditional read channel detection architecture 10 is shown. The architecture 10 includes a finite impulse response (FIR) filter 12 that receives data samples r(t) and generates an equalized data signal 14. The equalized signal 14 is received by a nonlinear Viterbi (NLV) detector 16 that has an internal Viterbi algorithm to determine the most likely sequence of hidden states. The Viterbi detector 16 produces a preliminary non-return-to-zero (NRZ) data estimates 18 and final NRZ data estimates 20. The final NRZ estimates are produced after a certain amount of latency. This latency is referred to as the Viterbi path memory length. The path memory length is set sufficiently long such that the surviving paths of the Viterbi algorithm merge with high probability and the final NRZ data estimates have good reliability. A surviving path is the most likely path to a particular hidden state.

The preliminary NRZ data estimates 18 have a smaller Viterbi path memory depth than the final NRZ data estimates 20 and thus are referred to as Viterbi early decisions. The early decisions are used to reconstruct the output of the FIR 12 by convolving with a partial response target or reconstruction filter 22. The preliminary NRZ data estimates 18 are received by the reconstruction filter 22 to generate reconstructed FIR outputs 24.

A delay block 26 is connected between the output 28 of the FIR 12 and the reconstruction filter 22. Reconstructed FIR outputs 24 are subtracted from the delayed FIR outputs 30 of the delay block 26 to generate an error signal 32. The error signal 32 is used to calculate error gradients for timing loop, automatic again control (AGC) loop, baseline correction loop, and FIR adaptation loop purposes.

The Viterbi early depth or path length of the preliminary NRZ estimates must be carefully and appropriately selected. When the early depth is too small, the Viterbi early decisions have too many errors, which cause the timing loop and the AGC loop to operate improperly. When the early depth is too long, the timing loop and the AGC loop cannot track fast-varying timing/gain errors.

During PMR of hard disk drives, the magnetoresistive read head produces a zero output voltage at magnetic transitions and a nonzero output in regions of constant magnetic polarity. Thus, the received signal r(t) in PMR has a nonzero DC response. In PMR, for example, a main source of DC distortion or DC noise is the data dependent wandering of the baseline value from AC-coupling in the preamplifier and read channel. The baseline value is a DC reference value. As such, the baseline correction loop is incorporated as a feedback to reduce this DC noise.

The above-described architecture of FIG. 1 has performance limits. The NLV detector is well-equipped to handle data-dependent media noise, but suffers a performance loss when receiving a time variant noise, such as DC noise, as described above when associated with PMR. This performance loss is primarily due to the relatively long latency of the baseline loop, which fails to adequately compensate for the time variant noise.

SUMMARY

A detector is provided and includes Viterbi detectors. A first Viterbi detector generates a preliminary decision signal. A second Viterbi detector generates a final decision signal based on an input data signal and the preliminary decision signal. The second Viterbi detector is arranged in series with the first Viterbi detector.

In other features, one or more of the Viterbi detectors generates preliminary decision signals. The final decision signal is generated based on the preliminary decision signals.

In other features, one or more of the Viterbi detectors generates a first preliminary decision signal and a second preliminary decision signal. The first preliminary decision signal has a longer associated depth than the second preliminary decision signal.

In still other features, the first Viterbi detector has a first depth and the second Vitebi detector has a second depth. In other features, the first depth is longer than the second depth.

In yet other features, a filter bank generates a filtered signal based on the preliminary decision signal. The second Viterbi detector generates the final decision signal based on the filtered signal. In other features, the filter bank includes filters that generate filtered signals. The second Viterbi detector generates the final decision signal based on the filtered signals. In other features, the filters are arranged in parallel relative to each other.

In further features, a first delay generates a first delay signal. A reconstruction filter generates a first reconstruction data signal based on the preliminary decision signal. A first summer generates an error signal based on the first delay signal and the preliminary decision signal. In other features, the reconstruction filter generates a second reconstruction signal based on the preliminary decision signal. The second Viterbi detector generates the final decision signal based on the second reconstruction signal.

In additional features, a second delay generates a second delay signal based on the first delay signal. A second summer generates a pre-filtered signal based on the second delay signal and the first reconstruction data signal. The second Viterbi detector generates the final decision signal based on the second delay signal and the pre-filtered signal. In other features, a third delay generates a third delay signal based on the second delay signal. A filter bank generates a filtered signal based on the pre-filtered signal. A third summer generates a pre-finalized decision signal based on the third delay signal and the filtered signal. The second Viterbi detector generates the final decision signal based on the pre-finalized decision signal.

A detection circuit is also provided and includes a filter that generates an equalized signal based on an input signal. A detector module includes Viterbi detectors that are arranged in series. The detector module generates a final decision signal based on the equalized signal.

In other features, a feedback loop receives an error signal that is generated by the detector module. In other features, the detector module generates the final decision signal based on the error signal. In other features, the feedback loop includes a timing loop, a gain loop, a filter loop, or a baseline loop. In other features, the feedback loop includes a timing loop, a gain loop, a filter loop, and a baseline loop. In other features, the feedback loop includes a timing loop that generates a timing signal based on the error signal. The Viterbi detectors generate the finalized decision signal based on the timing signal.

In other features, the feedback loop includes a gain loop that generates a gain signal based on the error signal. The Viterbi detectors generate the finalized decision signal based on the gain signal. In other features, the feedback loop includes a filter loop that generates a weight signal based on the error signal. The Viterbi detectors generate the finalized decision signal based on the weight signal. In other features, the feedback loop includes a baseline loop that generates a correction signal based on the error signal. The Viterbi detectors generate the finalized decision signal based on the correction signal.

In still other features, the Viterbi detectors include a first Viterbi detector that generates a preliminary decision signal. A second Viterbi detector generates the final decision signal based on the preliminary decision signal. In other features, a reconstruction filter generates an error signal based on the preliminary decision signal. A feedback loop generates a compensation signal based on the error signal. A response filter generates an equalized signal based on an input signal and the compensation signal. The second Viterbi detector generates the final decision signal based on the equalized signal.

A method of operating a read channel decoder is provided and includes generating a preliminary decision signal via a first Viterbi detector. A final decision signal is generated based on an input data signal and the preliminary decision signal via a second Viterbi detector, which is arranged in series with the first Viterbi detector.

In other features, preliminary decision signals are generated. The final decision signal is generated based on the preliminary decision signals.

In other features, a first preliminary decision signal and a second preliminary decision signal are generated. The first preliminary decision signal has a longer associated depth than the second preliminary decision signal.

In yet other features, a filtered signal is generated based on the preliminary decision signal. The final decision signal is generated based on the filtered signal. In other features, filtered signals are generated. The final decision signal is generated based on the filtered signals.

In further features, a first delay signal is generated. A first reconstruction data signal is generated based on the preliminary decision signal. An error signal is generated based on the first delay signal and the preliminary decision signal. In other features, a second reconstruction signal is generated based on the preliminary decision signal. The final decision signal is generated based on the second reconstruction signal.

In other features, a second delay signal is generated based on the first delay signal. A pre-filtered signal is generated based on the second delay signal and the first reconstruction data signal. The final decision signal is generated based on the second delay signal and the pre-filtered signal. In other features, a third delay signal is generated based on the second delay signal. A filtered signal is generated based on the pre-filtered signal. A pre-finalized decision signal is generated based on the third delay signal and the filtered signal. The final decision signal is generated based on the pre-finalized decision signal.

An additional method of operating a read channel decoder is provided and includes generating an equalized signal based on an input signal. A final decision signal is generated based on the equalized signal via serially arranged Viterbi detectors.

In other features, an error signal is received and the final decision signal is generated based on the error signal. In other features, a timing signal is generated based on the error signal. The finalized decision signal is generated based on the timing signal. In other features, a gain signal is generated based on the error signal. The finalized decision signal is generated based on the gain signal.

In other features, a weight signal is generated based on the error signal. The finalized decision signal is generated based on the weight signal. In other features, a correction signal is generated based on the error signal. The finalized decision signal is generated based on the correction signal.

In yet other features, a preliminary decision signal is generated and the final decision signal is generated based on the preliminary decision signal. In other features, an error signal is generated based on the preliminary decision signal. A compensation signal is generated based on the error signal. An equalized signal is generated based on an input signal and the compensation signal. The final decision signal is generated based on the equalized signal.

An additional detector is provided and includes first Viterbi detector means for generating a preliminary decision signal. The detector includes second Viterbi detector means for generating a final decision signal based on an input data signal and the at least one preliminary decision signal. The second Viterbi detector means is arranged in series with the first Viterbi detector means.

In other features, the first and second Viterbi detector means generates preliminary decision signals and the final decision signal is generated based on the preliminary decision signals.

In still other features, the first and second Viterbi detector means generates a first preliminary decision signal and a second preliminary decision signal. The first preliminary decision signal has a longer associated depth than the second preliminary decision signal.

In other features, the first Viterbi detector means has a first depth and the second Viterbi detector means has a second depth. In other features, the first depth is longer than the second depth.

In further features, a filter means generates a filtered signal based on the preliminary decision signal. The second Viterbi detector means generates the final decision signal based on the filtered signal. In other features, the filter means generate filtered signals. The second Viterbi detector means generates the final decision signal based on the filtered signals.

In other features, first delay means generates a first delay signal. Reconstruction filter means generates a first reconstruction data signal based on the preliminary decision signal. First summing means generates an error signal based on the first delay signal and the preliminary decision signal. In other features, the reconstruction filter means generates a second reconstruction signal based on the preliminary decision signal. The second Viterbi detector means generates the final decision signal based on the second reconstruction signal.

In other features, second delay means generates a second delay signal based on the first delay signal. Second summing means generates a pre-filtered signal based on the second delay signal and the first reconstruction data signal. The second Viterbi detector means generates the final decision signal based on the second delay signal and the pre-filtered signal. In other features, third delay means generates a third delay signal based on the second delay signal. Filter means generates a filtered signal based on the pre-filtered signal. Third summing means generates a pre-finalized decision signal based on the third delay signal and the filtered signal. The second Viterbi detector means generates the final decision signal based on the pre-finalized decision signal.

In yet other features, filter means that generates an equalized signal based on an input signal. Detector means includes the first and second Viterbi detector means that are arranged in series. The detector means generates a final decision signal based on the equalized signal.

In additional features, feedback means receives an error signal that is generated by the detector means. In other features, the detector means generates the final decision signal based on the error signal. In other features, the feedback means includes timing means, gain means, filter means, or baseline means. In other features, the feedback means includes timing means, gain means, filter means, and baseline means.

In other features, the feedback means includes timing means that generates a timing signal based on the error signal. The first and second Viterbi detector means generates the finalized decision signal based on the timing signal.

In other features, the feedback means includes gain means that generates a gain signal based on the error signal. The first and second Viterbi detector means generates the finalized decision signal based on the gain signal. In other features, the feedback means includes filter means that generates a weight signal based on the error signal. The first and second Viterbi detector means generates the finalized decision signal based on the weight signal.

In still other features, the feedback means includes baseline means that generates a correction signal based on the error signal. The first and second Viterbi detector means generate the finalized decision signal based on the correction signal. In other features, the first Viterbi detector means generates a preliminary decision signal. The second Viterbi detector means generates the final decision signal based on the preliminary decision signal. In other features, reconstruction filter means generates an error signal based on the preliminary decision signal. Feedback means generates a compensation signal based on the error signal. Response filter means generates an equalized signal based on an input signal and the compensation signal. The second Viterbi detector means generates the final decision signal based on the equalized signal.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a high level block diagram of a read channel detection architecture according to the prior art;

FIG. 2 is a functional block diagram illustrating a coded storage system incorporating a multi-Viterbi detector according to an embodiment of the present disclosure;

DETAILED DESCRIPTION

Figure 3:
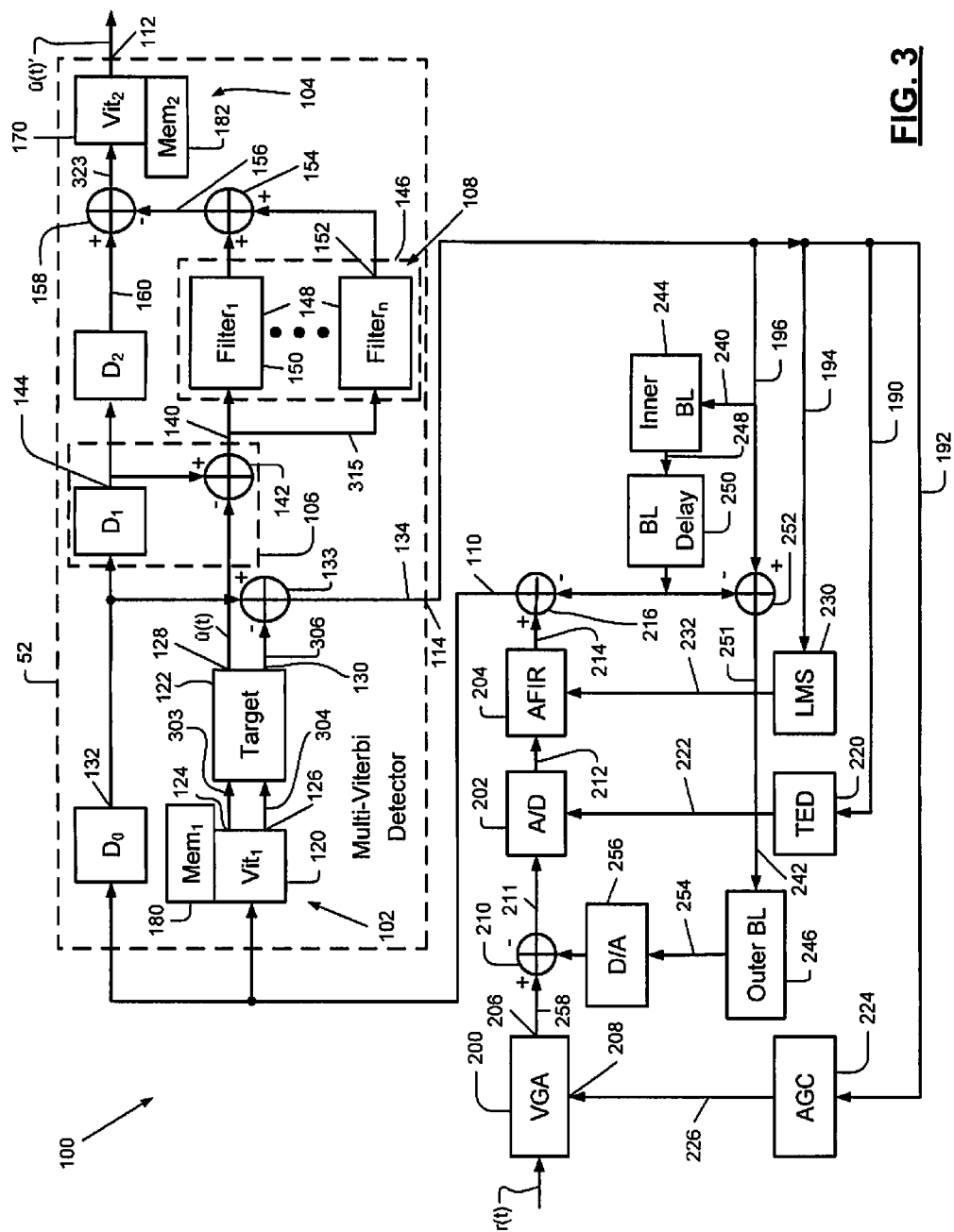
FIG. 3 is a functional block diagram of a composite sequence receive channel detection circuit according to an embodiment of the present disclosure.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

It is desirable in perpendicular magnetic recording to minimize DC noise or noise around the DC information signal. One technique that may be used to reduce the DC noise is to reduce the baseline loop latency to obtain early decisions by use of a smaller Viterbi depth. Although such a technique reduces DC noise, it increases the risk associated with the break down of timing loop and automatic gain control. The embodiments of the present disclosure reduce the DC noise without negatively affecting timing loop and automatic gain control.

Referring to FIG. 2, a coded storage system 50 that incorporates a multi-Viterbi detector module 52 is shown. The storage system 50 includes a write path 54 and a read path 56. The write path 54 has a channel encoder 58 that receives an information data stream u(t) and generates a codeword data stream v(t). The codeword data stream v(t) is received by a modulator 60 and written to a channel/storage medium 62. Although the embodiment of FIG. 2 is directed to a storage system, one skilled in the art would recognize its applicability to other communication mediums. As such, the write path 54, the read path 56 and the channel/storage medium 62 may refer to any transmit path, receive path and encoded communication channel.

Signal n represents the noise that is experienced by and thus in effect added to the modulated signal 60. The combination of the noise n with the modulated signal 60 is received by a demodulator 70 of the read path 56. The demodulator 70 generates a received signal r(t), which is transmitted to a channel decoder 72. The channel decoder 72 contains the multi-Viterbi detector 52. The multi-Viterbi detector 52 generates an error signal based on the received signal r(t). An example error signal is shown and described with respect to the embodiment of FIG. 3. The error signal is used to drive feedback loops within the channel decoder 72, which in turn affects the information output signal û(t). The multi-Viterbi detector 52 and the operation thereof are described in further detail below.

Referring to FIG. 3, a functional block diagram of a composite sequence read channel detection circuit 100 is shown. The read channel circuit 100 may be referred to as a channel decoder and includes the multi-Viterbi detector 52. The detector 52 includes multiple Viterbi stages 102, 104, one or more delay circuits 106, and one or more filter stages 108. Although the multi-Viterbi detector 52 is shown as having two Viterbi stages, additional Viterbi stages may be incorporated. The filter stage 108 is connected between the Viterbi stages 102, 104. The multi-Viterbi detector 52 has a detector input 110, a final data output 112 and an error loop signal output 134.

The first Viterbi stage 102 includes a first Viterbi detector module 120 followed by a target or reconstruction filter 122. A first delay block $D_0$ is configured in a feedforward arrangement relative to the first Viterbi detector 120 and the reconstruction filter 122. The first delay $D_0$ matches the sum of the pipe delay of the first Viterbi detector 120, the delay of the early decision path memory of the Viterbi detector 120 and/or the pipe delay of the reconstruction filter 122. The first Viterbi detector 120 has a first Viterbi output 124 and a second Viterbi output 126. The first Viterbi output 124 has an associated first Viterbi path memory depth. The second Viterbi output 126 has an associated second Viterbi path memory depth that is shorter than the first depth.

The reconstruction filter 122 has a long decision or first reconstruction filter output 128 and an early decision or second reconstruction filter output 130. The long decision output 128 is associated with the first Viterbi output 124 and provides a long decision output signal û(t). The early decision output 130 is associated with the second Viterbi output 126. The delay output 132 of the first delay $D_0$ and the early decision output 130 are connected to a first error generator summer 133. The summer 133 generates an error signal 134.

The first delay $D_0$ is connected to a second delay $D_1$ of the delay circuit 106. The second delay $D_1$ may match the signal delay associated with the generation of a sub-final Viterbi decision 126 of the first Viterbi detector 120, i.e., the difference between the first depth and the second depth. The long decision output 128 is connected to a second error generator summer 142. The second summer 142 provides the sum of the delay output signal 144 from the second delay $D_1$ and the long decision output signal û(t) to a filter bank 146 of the filter stage 108.

Note that the reconstruction filter 122 may have a single output, or in other words, the reconstruction filter 122 may not have the long decision output 128. The early decision output 130 may be shared and provided to the first summer 133 and to the second summer 142.

The filter stage 108 includes the filter bank 146, which has multiple filters 148 with different associated pass band frequencies. The filters extract the noise components of the frequency noise of interest. The noise may be DC noise, noise around a Nyquist frequency, or other noise of interest. For example, a first filter 150 may be a low pass filter that removes the low frequency noise, which is present in perpendicular recording. A third delay $D_2$ is connected in series with the second delay $D_1$ and may match the signal delay or latency associated with the filter bank 146. Filtered signal outputs 152 of the filter bank 146 are summed by a third summer 154. The filtered sum 156 or combined filter output signal is then summed, via a fourth summer 158, with the delay signal output 160 of the third delay $D_2$.

The second stage 104 includes a second Viterbi detector module 170. The second Viterbi detector 170 is connected to the fourth summer 158 and generates the final output signal û(t)'. The second Viterbi detector 170 has a second Viterbi path memory and a second Viterbi pipe delay that are respectively shorter than the first Viterbi path memory and the first Viterbi pipe delay.

Note that additional Viterbi stages may be coupled in series with the second stage 104 for additional filtering. Additional Viterbi stage coupling is similar to that of the second stage 104 relative to the first stage 102. With each additional Viterbi stage an additional delay circuit and an additional filter stage, similar to the delay circuit 106 and the filter stage 108, may be incorporated. The additional delay circuits and filter stages are incorporated between each additional Viterbi stage and its preceding Viterbi stage. Signal processing between Viterbi stages is not limited to filtering. Other linear or non-linear noise suppression techniques can be used.

Each Viterbi detector has associated Viterbi depth(s) or constraint length(s). The depths refer to the number of cycles an input bit is retained and used after it first appears at a Viterbi detector input. The depths may be referred to as memory lengths and correspond to a position within a memory buffer, such as in one of the memories 180, 182 of the Viterbi detectors 120, 170.

In general, the first Viterbi detector 120 has a smaller depth and is less accurate than the second Viterbi detector 170. Likewise, each additional and subsequent Viterbi detector may have a larger depth than its predecessor. In the embodiment shown, the first Viterbi detector 120 has a substantially smaller depth than the second Viterbi detector 170. The depth $Vitdepth_2$ of the second Viterbi detector 170 is approximately equal to three times the depth $Vitdepth_1$ of the first Viterbi detector 120, or $Vitdepth_2=3*Vitdepth_1$. For this reason, the first Viterbi detector 120 may be referred to as a small detector and the second Viterbi detector 170 may be referred to as a big detector.

The first Viterbi detector 120 generates preliminary non-return-to-zero (NRZ) data estimates to drive a timing loop 190, an automatic gain control (AGC) loop 192, an adaptive impulse response (AFIR) filter 194 and a DC/baseline loop 196. The first Viterbi detector 120 also estimates noise for further cancellation. The second Viterbi detector 170 may be used as a post-processor to improve the quality of the preliminary NRZ estimates using the noise estimates from the first Viterbi detector 120.

The operation of the multi-Viterbi detector 52 is described in further detail below with respect to the embodiment of FIG. 4.

In addition to the multi-Viterbi detector 52, the detection circuit 100 also includes a variable gain amplifier (VGA) 200, an analog-to-digital (N/D) converter 202 and an AFIR filter 204, which are in series with the detector 52. The detection circuit 100 receives the received signal r(t), which is passed through the VGA 200. The VGA 200 amplifies the received signal r(t) and has a VGA output 206 and a VGA feedback input 208. The VGA output 206 is connected to a first baseline summer 210 followed by the ND converter 202. The ND converter 202 is connected to the AFIR filter 204, which generates an equalized data output signal. The ND converter 202 converts the analog output signal 211 from the first baseline summer 210 into a digital input signal 212. The AFIR 204 generates an equalized data input signal 214 based on the digital input signal 212. The error signal 134 and the final output signal û(t)' are generated based on the equalized signal 214. A second baseline summer 216 is connected between the AFIR 204 and the detector 52.

The following feedback loops are provided solely for example purposes. The feedback loops may be modified for various applications. Also, the feedback loops shown and described herein are not all inclusive; additional feedback loops may be incorporated. One or more of the feedback loops may be used, depending on the application.

The VGA 200, the A/D converter 202, the AFIR 204 and the multi-Viterbi detector 52 operate based on the feedback signals received from the timing loop 190, the AGC loop 192, the AFIR loop 194, and the baseline loop 196. The timing loop 190 is used for timing recovery of the originally transmitted encoded information signal. The timing loop 190 is shown as a feedback loop that receives the error signal 134 and adjusts the timing of the A/D converter 202. The timing loop 190 may include a timing error detector 220, as shown, and/or one or more filters and oscillators, such as a voltage controlled oscillator or a numerically controlled oscillator. The timing loop 190 may be and/or also include a phase lock loop. The timing error detector 220 generates a timing correction signal 222 that is received by the A/D converter 202.

The AGC loop 192 is shown as a feedback loop that receives the error signal 134 and adjusts the gain on the VGA 200. The AGC loop 192 may have an AGC block 224 for processing and monitoring of the error signal 134. The AGC block 224 generates a gain correction control signal 226, which is provided to the VGA 200.

The AFIR loop 194 is also shown as a feedback loop that receives the error signal 134 and adjusts filter cutoff frequencies and/or other filter characteristics of the AFIR 204. The AFIR loop 194 may have a least means-square (LMS) block 230, which adjusts the weight vectors for the AFIR 204 to provide the minimum mean square error. The LMS 230 generates a weight correction signal 232 that is received by the AFIR 204.

The baseline loop 196 is used for tracking an unknown or varying DC signal, such as that within perpendicular magnetic recording and may include one or more baseline sub-loops. In the example shown in FIG. 3, the baseline loop 196 includes a primary or inner loop 240 and an outer loop 242. The inner loop 240 provides correction at the Viterbi detector input 110. The outer loop 242 limits the DC offset to the A/D converter 202 and prevents clipping. The inner loop 240 includes an inner baseline (BL) block 244 and the outer loop 242 includes an outer BL block 246.

The inner BL block 244 receives the error signal 134 and generates an inner baseline correction signal 248. The outer block 246 receives the error signal 134 adjusted by a delayed version of the inner correction signal 248. The inner correction signal 248 is delayed via a BL delay block 250 and subtracted from the error signal 134 by a BL summer 252 to generate a corrected equalized input signal 251. The corrected equalized signal 251 is received by the detector 52. The outer BL block 246 generates an outer baseline correction signal 254 based on the error signal 134 and the inner correction signal 248. The stated subtraction removes the inner BL correction term from the outer BL loop 242. Thus, the outer BL loop 242 is independent of the inner BL loop 240. The outer correction signal 254 is converted into analog form by a digital-to-analog (D/A) converter 256 for subtraction from the amplified output signal 258 of the VGA 200.

Figure 4:
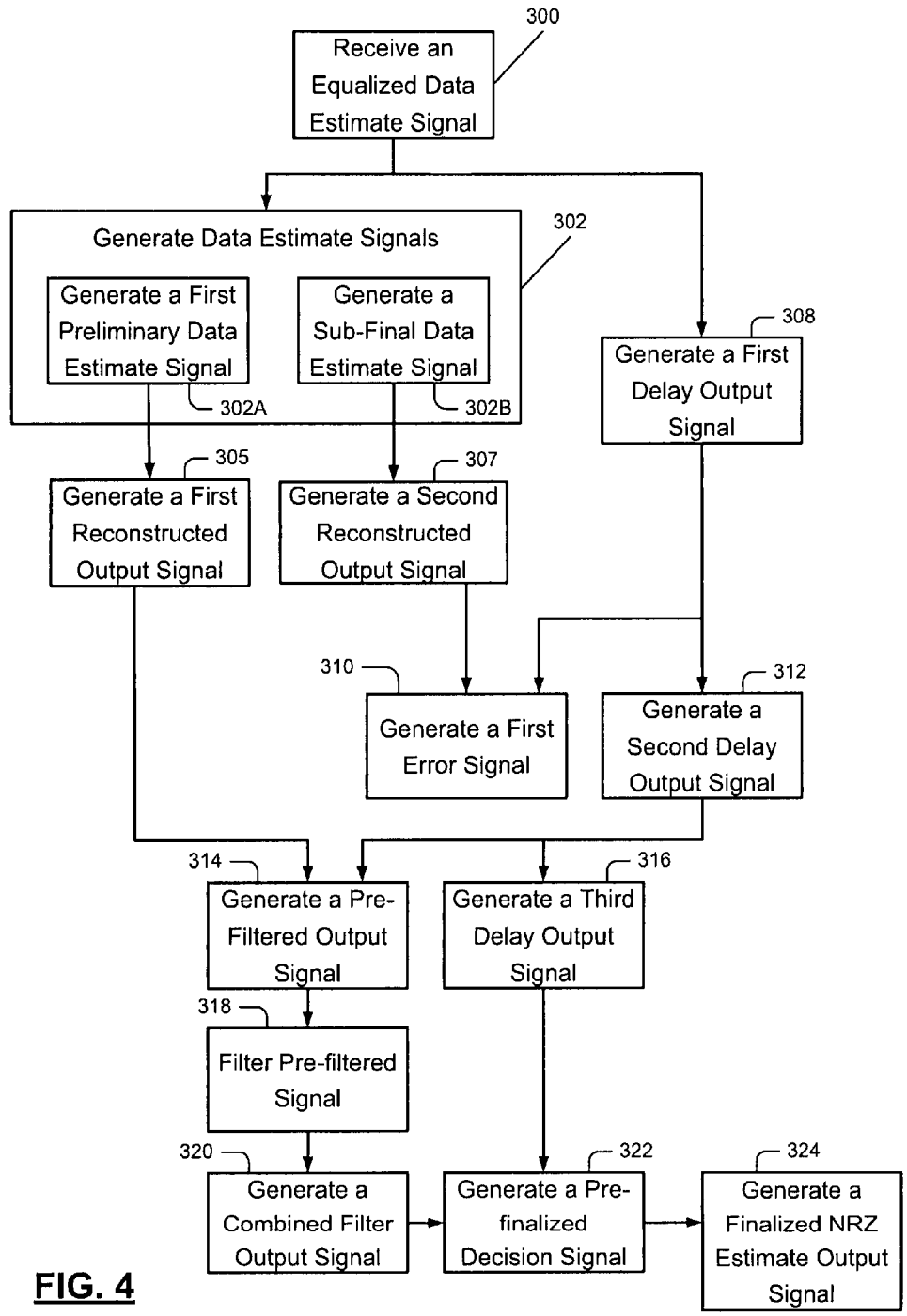
FIG. 4 is a data flow diagram illustrating an operational method of a receive channel decoder according to an embodiment of the present disclosure.

Referring to FIGS. 3 and 4, a data flow diagram illustrating an operational method of a read channel decoder is shown. Although the following steps are described primarily with respect to the embodiment of FIG. 3, they may be easily modified to apply to other embodiments of the present disclosure.

In step 300, an equalized data estimate signal, such as the equalized signal 214 or the corrected equalized signal 110 is received by a multi-Viterbi detector module, such as the multi-Viterbi detector 52. The equalized signal is simultaneously received by a small Viterbi detector module and a first delay device, such as the first Viterbi detector 120 and the first delay $D_0$. The equalized signal is split into two streams. The first stream is passed to the small Viterbi detector for feedback loop control. The second stream is passed to a first delay, such as the first delay $D_0$. In the following steps, the second stream is subtracted with noise estimates and passed to a big Viterbi detector, such as the big Viterbi detector 170, to generate final NRZ data estimates in the form of a final decision. The second stream is delayed to match the small Viterbi detector and the filter latency. Use of the small Viterbi detector for feedback loop control minimizes latency, which allows for high speed signal throughput of the multi-Viterbi detector 52.

In step 302, the small Viterbi detector generates preliminary NRZ data estimate signals, such as the signals 303, 304 based on the corrected equalized signal. In step 302A, a first preliminary NRZ data estimate signal or long decision signal is generated based on a first Viterbi pipe delay and a first Viterbi early depth. In step 302B, a second preliminary NRZ data estimate signal or early decision signal is generated based on a second Viterbi pipe delay and a second Viterbi early depth. A Viterbi pipe delay refers to the time delay or number of clock cycles to perform the Viterbi decoding process of concern. In other words, a pipe delay is the computational length of the Viterbi detector of interest or portion thereof. In one embodiment, the first pipe delay is set equal to the second pipe delay and the second early depth is set less than the first early depth. Of course, the early depth values are arbitrary relative values and may vary per application. The delays and the depths of steps 302A and 302B may be predetermined set values stored in the Viterbi detector, a designated memory or otherwise generated.

In step 305, a first reconstructed output signal 306 is generated based on the first preliminary NRZ estimate signal via a reconstruction filter, such as the reconstruction filter 122. The reconstruction filter uses the early decision Viterbi output to reconstruct a noise free Viterbi detector input. For example, if a Viterbi detector is matched to an equalization target H(D), then the associated reconstruction filter convolves the full decision Viterbi detector output with the equalization target H(D).

In step 307, a second reconstructed output signal û(t) is generated based on the second preliminary NRZ estimate signal via the reconstruction filter. The second preliminary signal may have a shorter associated Viterbi depth than the first preliminary signal. The second preliminary signal is used to extract noise components in the corrected equalized signal.

In step 308, a first delay filter output signal 309 is generated based on the corrected equalized signal and a first delay, such as the delay $D_0$. The first delay may correspond and/or match the delay through the Viterbi detector associated with the first preliminary NRZ estimate signal. Step 308 may be performed simultaneously with steps 302-307.

In step 310, an error signal, such as the error signal 134, is generated based the second reconstructed data signal and the first delay signal. A first Viterbi summer, such as the first Viterbi summer 133, subtracts the second reconstructed signal from the first delay signal to generate the error signal. The error signal is provided to a timing loop, an AGC loop, an AFIR loop, and/or a DC/baseline loop, such as the loops 190-196.

In step 312, a second delay filter output signal, such as the second delay signal 144, is generated. A second delay device, such as the second delay $D_1$, further delays the equalized data signal to generate the second delay signal.

In step 314, the first reconstructed output signal is subtracted from the second delay signal to generate a pre-filtered signal 315. In effect, the delayed equalized signal is adjusted via the reconstructed filter output.

In step 316, a third delay filter output signal, such as the delay signal 160, is generated. A third delay device, such as the third delay $D_2$, further delays the equalized data signal to generate a third delay signal.

In step 318, the pre-filtered signal is filtered via filter bank, such as the filter bank 146. Steps 316 and 318 may be performed simultaneously. The pre-filtered signal is passed through multiple filters of the filter bank to remove the noise components of interest. Step 316 may be performed simultaneously with steps 314 and 318.

In step 320, the filtered output signals of the filter bank are summed to generate a combined filter output signal, such as the combined filter output signal 156.

In step 322, the combined filtered signal is subtracted from the third delay signal to generate a pre-finalized decision signal 323, which is noise-suppressed. The input samples of the small Viterbi detector are essentially buffered and from which the noise estimates from the filters are subtracted. The noise cancellation improves the signal-to-noise ratio (SNR) of the input samples to the big Viterbi detector. Thus, a better bit error rate (BER) performance is achieved for the overall system than that of a single Viterbi detector.

In step 324, a finalized NRZ estimate output signal û(t)' is generated via a second Viterbi detector, such as the second Viterbi detector 170.

The above-described steps and the use of a small Viterbi detector followed by a big Viterbi detector prevent a loss when receiving a time variant noise. The above-described steps may be performed sequentially, simultaneously, or in a different order depending upon the application.

Of course, the above-described read channel circuit 100, the method of FIG. 4 and, in general, the embodiments of the present disclosure may be applied to applications fall under IEEE standards 802.11, 802.11a, 802.11b, 802.11g, 802.11h, 802.11n, 802.16, and 802.20. Also, the embodiments of the present invention may be applied in wireless Bluetooth applications or in other applications in which information is being received from a storage or communication channel.

Referring now to FIGS. 5A-5G, various exemplary implementations incorporating the teachings of the present disclosure are shown.

Figure 5A:
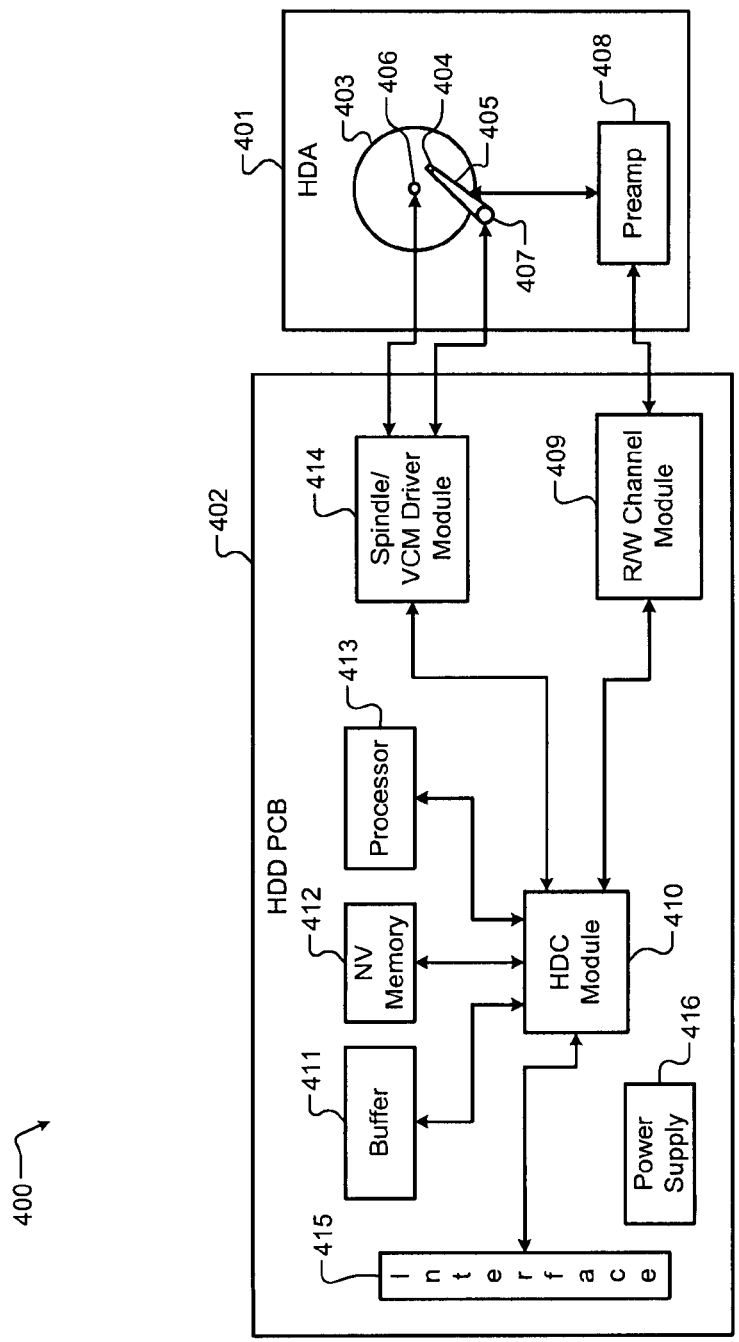
FIG. 5A is a functional block diagram of a hard disk drive.

Referring now to FIG. 5A, the teachings of the disclosure can be implemented in a read/write channel module (hereinafter, "read channel") 409 and/or an I/O Interface 415 of a hard disk drive (HDD) 400. For example, the above-described read channel reception circuit may be used to receive and decode information from a magnetic medium 403 of the HDD 400 or other channel. The HDD 400 includes a hard disk assembly (HDA) 401 and a HDD PCB 402. The HDA 401 may include the magnetic medium 403, such as one or more platters that store data, and a read/write device 404. The read/write device 404 may be arranged on an actuator arm 405 and may read and write data on the magnetic medium 403. Additionally, the HDA 401 includes a spindle motor 406 that rotates the magnetic medium 403 and a voice-coil motor (VCM) 407 that actuates the actuator arm 405. A preamplifier device 408 amplifies signals generated by the read/write device 404 during read operations and provides signals to the read/write device 404 during write operations.

The HDD PCB 402 includes the read channel 409, a hard disk controller (HDC) module 410, a buffer 411, nonvolatile memory 412, a processor 413, and a spindle/VCM driver module 414. The read channel 409 processes data received from and transmitted to the preamplifier device 408. The HDC module 410 controls components of the HDA 401 and communicates with an external device (not shown) via the I/O interface 415. The external device may include a computer, a multimedia device, a mobile computing device, etc. The I/O interface 415 may include wireline and/or wireless communication links.

The HDC module 410 may receive data from the HDA 401, the read channel 409, the buffer 411, nonvolatile memory 412, the processor 413, the spindle/VCM driver module 414, and/or the I/O interface 415. The processor 413 may process the data, including encoding, decoding, filtering, and/or formatting. The processed data may be output to the HDA 401, the read channel 409, the buffer 411, nonvolatile memory 412, the processor 413, the spindle/VCM driver module 414, and/or the I/O interface 415.

The HDC module 410 may use the buffer 411 and/or nonvolatile memory 412 to store data related to the control and operation of the HDD 400. The buffer 411 may include DRAM, SDRAM, etc. The nonvolatile memory 412 may include flash memory (including NAND and NOR flash memory), phase change memory, magnetic RAM, or multi-state memory, in which each memory cell has more than two states. The spindle/VCM driver module 414 controls the spindle motor 406 and the VCM 407. The HDD PCB 402 includes a power supply 416 that provides power to the components of the HDD 400.

Figure 5B:
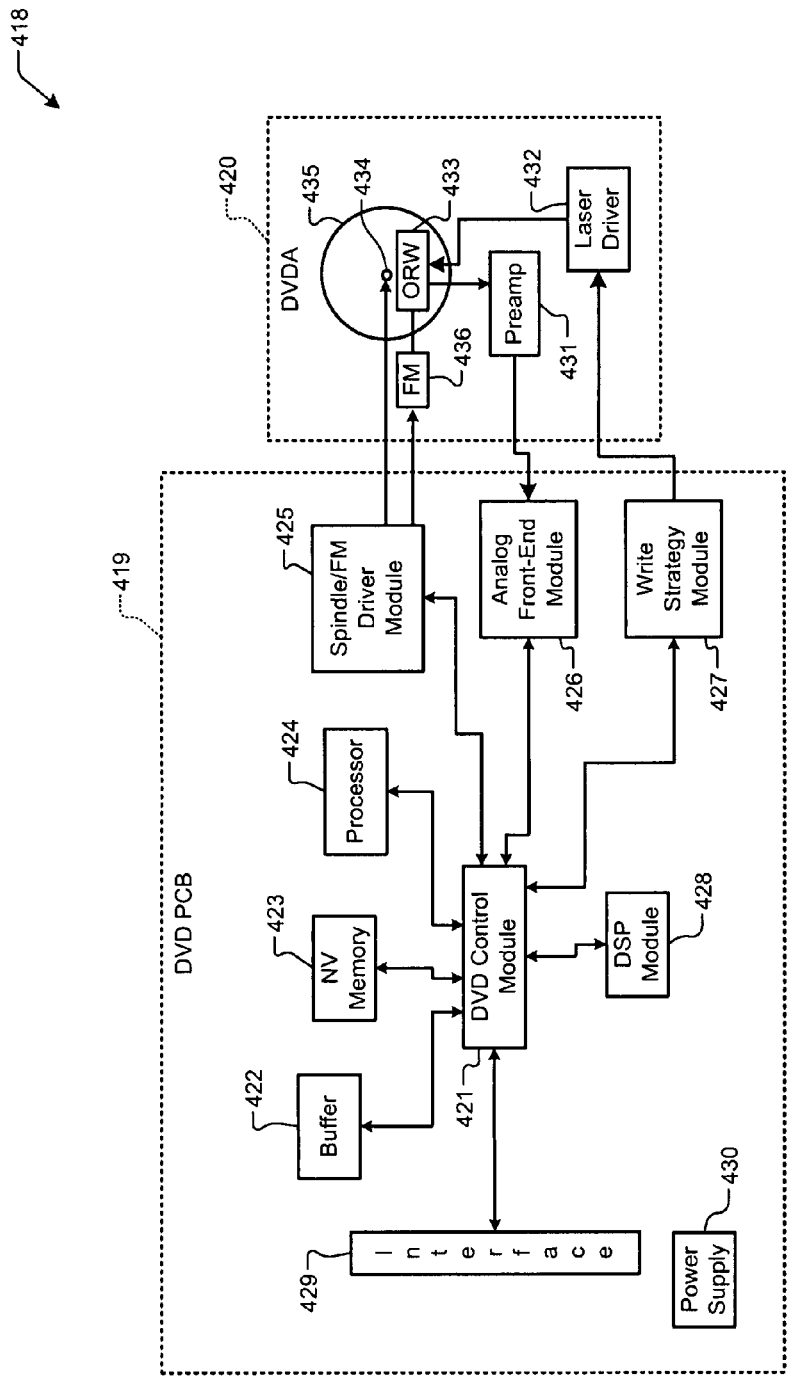
FIG. 5B is a functional block diagram of a DVD drive.

Referring now to FIG. 5B, the teachings of the disclosure can be implemented in an optical device 433 and/or an I/O interface 429 of a DVD drive 418 or of a CD drive (not shown). As with the HDD 400, the read channel circuit 100 may be incorporated into the DVD drive 418 to receive and decode information from a channel. The DVD drive 418 includes a DVD PCB 419 and a DVD assembly (DVDA) 420. The DVD PCB 419 includes a DVD control module 421, a buffer 422, nonvolatile memory 423, a processor 424, a spindle/FM (feed motor) driver module 425, an analog front-end module 426, a write strategy module 427, and a DSP module 428.

The DVD control module 421 controls components of the DVDA 420 and communicates with an external device (not shown) via an I/O interface 429. The external device may include a computer, a multimedia device, a mobile computing device, etc. The I/O interface 429 may include wireline and/or wireless communication links.

The DVD control module 421 may receive data from the buffer 422, nonvolatile memory 423, the processor 424, the spindle/FM driver module 425, the analog front-end module 426, the write strategy module 427, the DSP module 428, and/or the I/O interface 429. The processor 424 may process the data, including encoding, decoding, filtering, and/or formatting. The DSP module 428 performs signal processing, such as video and/or audio coding/decoding. The processed data may be output to the buffer 422, nonvolatile memory 423, the processor 424, the spindle/FM driver module 425, the analog front-end module 426, the write strategy module 427, the DSP module 428, and/or the I/O interface 429.

The DVD control module 421 may use the buffer 422 and/or nonvolatile memory 423 to store data related to the control and operation of the DVD drive 418. The buffer 422 may include DRAM, SDRAM, etc. The nonvolatile memory 423 may include flash memory (including NAND and NOR flash memory), phase change memory, magnetic RAM, or multi-state memory, in which each memory cell has more than two states. The DVD PCB 419 includes a power supply 430 that provides power to the components of the DVD drive 418.

The DVDA 420 may include a preamplifier device 431, a laser driver 432, and an optical device 433, which may be an optical read/write (ORW) device or an optical read-only (OR) device. A spindle motor 434 rotates an optical storage medium 435, and a feed motor 436 actuates the optical device 433 relative to the optical storage medium 435.

When reading data from the optical storage medium 435, the laser driver provides a read power to the optical device 433. The optical device 433 detects data from the optical storage medium 435, and transmits the data to the preamplifier device 431. The analog front-end module 426 receives data from the preamplifier device 431 and performs such functions as filtering and A/D conversion. To write to the optical storage medium 435, the write strategy module 427 transmits power level and timing information to the laser driver 432. The laser driver 432 controls the optical device 433 to write data to the optical storage medium 435.

Figure 5D:
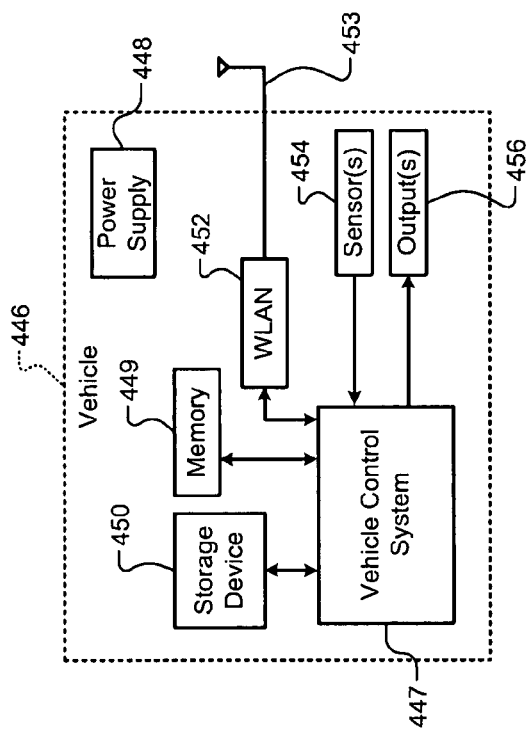
FIG. 5D is a functional block diagram of a vehicle control system.
Figure 5C:
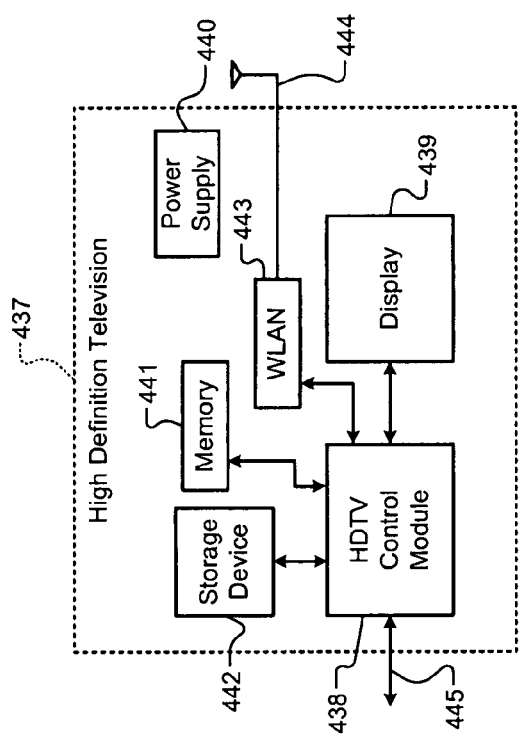
FIG. 5C is a functional block diagram of a high definition television.

Referring now to FIG. 5C, the teachings of the disclosure can be implemented in a WLAN interface 443 of a high definition television (HDTV) 437. As with the HDD 400, the read channel circuit 100 may be incorporated into the HDTV 437 to receive and decode information from a channel. The HDTV 437 includes a HDTV control module 438, a display 439, a power supply 440, memory 441, a storage device 442, the WLAN interface 443 and associated antenna 444, and an external interface 445.

The HDTV 437 can receive input signals from the WLAN interface 443 and/or the external interface 445, which sends and receives information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the WLAN interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the WLAN interface 443 and/or the external interface 445. The power supply 440 provides power to the components of the HDTV 437.

Referring now to FIG. 5D, the teachings of the disclosure may be implemented in a WLAN interface 452 of a vehicle 446. As with the HDD 400, the read channel circuit 100 may be incorporated into the vehicle 446 to receive and decode information from a channel. The vehicle 446 may include a vehicle control system 447, a power supply 448, memory 449, a storage device 450, and the WLAN interface 452 and associated antenna 453. The vehicle control system 447 may be a powertrain control system, a body control system, an entertainment control system, an anti-lock braking system (ABS), a navigation system, a telematics system, a lane departure system, an adaptive cruise control system, etc.

The vehicle control system 447 may communicate with one or more sensors 454 and generate one or more output signals 456. The sensors 454 may include temperature sensors, acceleration sensors, pressure sensors, rotational sensors, airflow sensors, etc. The output signals 456 may control engine operating parameters, transmission operating parameters, suspension parameters, etc.

The power supply 448 provides power to the components of the vehicle 446. The vehicle control system 447 may store data in memory 449 and/or the storage device 450. Memory 449 may include random access memory (RAM) and/or nonvolatile memory such as flash memory, phase change memory, or multi-state memory, in which each memory cell has more than two states. The storage device 450 may include an optical storage drive, such as a DVD drive, and/or a hard disk drive (HDD). The vehicle control system 447 may communicate externally using the WLAN interface 452.

Figure 5F:
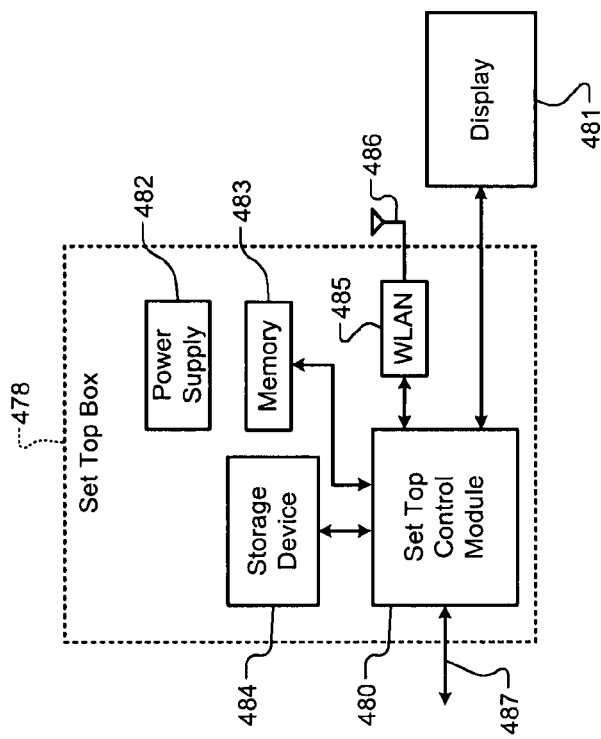
FIG. 5F is a functional block diagram of a set top box.
Figure 5E:
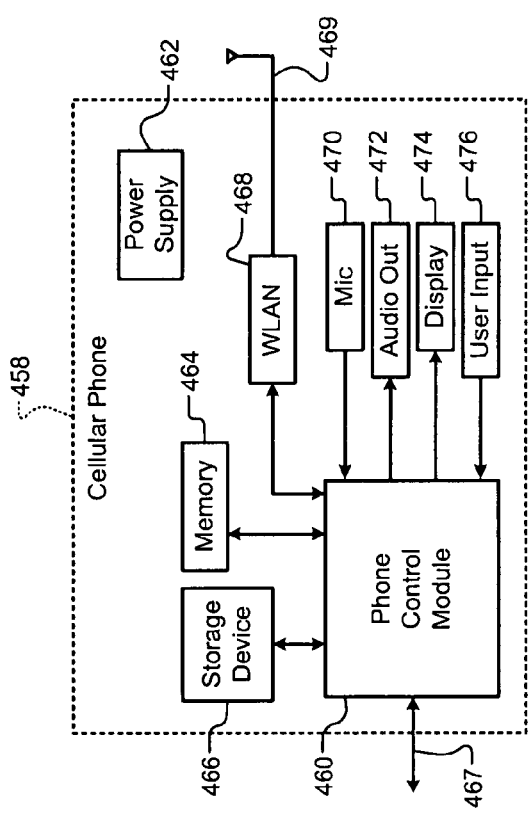
FIG. 5E is a functional block diagram of a cellular phone.

Referring now to FIG. 5E, the teachings of the disclosure can be implemented in a WLAN interface 468 of a cellular phone 458. As with the HDD 400, the read channel circuit 100 may be incorporated into the cellular phone 458 to receive and decode information from a channel. The cellular phone 458 includes a phone control module 460, a power supply 462, memory 464, a storage device 466, and a cellular network interface 467. The cellular phone 458 may include the WLAN interface 468 and associated antenna 469, a microphone 470, an audio output 472 such as a speaker and/or output jack, a display 474, and a user input device 476 such as a keypad and/or pointing device.

The phone control module 460 may receive input signals from the cellular network interface 467, the WLAN interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the WLAN interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 5F, the teachings of the disclosure can be implemented in a WLAN interface 485 of a set top box 478. As with the HDD 400, the read channel circuit 100 may be incorporated into the set top box 478 to receive and decode information from a channel. The set top box 478 includes a set top control module 480, a display 481, a power supply 482, memory 483, a storage device 484, and the WLAN interface 485 and associated antenna 486.

The set top control module 480 may receive input signals from the WLAN interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the WLAN interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Figure 5G:
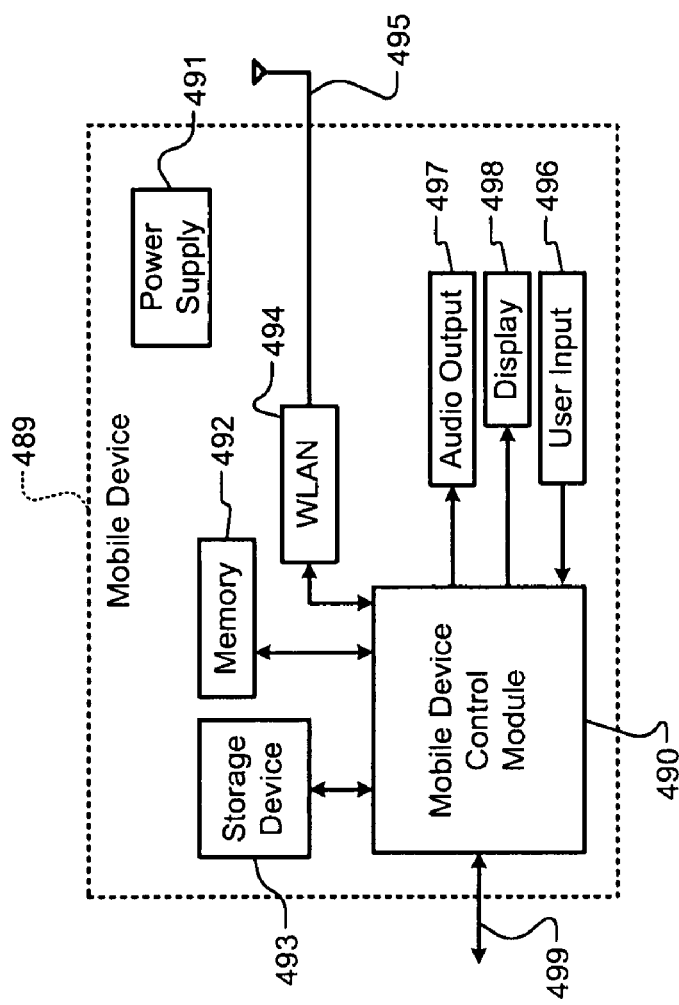
FIG. 5G is a functional block diagram of a mobile device.

Referring now to FIG. 5G, the teachings of the disclosure can be implemented in a WLAN interface 494 of a mobile device 489. As with the HDD 400, the read channel circuit 100 may be incorporated into the mobile device 489 to receive and decode information from a channel. The mobile device 489 may include a mobile device control module 490, a power supply 491, memory 492, a storage device 493, the WLAN interface 494 and associated antenna 495, and an external interface 499.

The mobile device control module 490 may receive input signals from the WLAN interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A detection circuit comprising:
an impulse response filter configured to generate an equalized signal based on an input data signal;
a first Viterbi detector configured to generate at least one preliminary decision signal including preliminary non-return-to-zero data estimates based on the equalized signal;
a plurality of filters configured to (i) receive the at least one preliminary decision signal and (ii) generate a filtered signal based on the at least one preliminary decision signal; and
a second Viterbi detector (i) arranged in series with the first Viterbi detector and (ii) configured to generate a final decision signal including final non-return-to-zero estimates based on a sum of (i) a delayed version of the equalized signal and (ii) the filtered signal.

2. The detection circuit of claim 1, wherein:
the first Viterbi detector is configured to generate a plurality of preliminary decision signals; and
the plurality of filters are configured to (i) receive the plurality of preliminary decision signals and (ii) generate the final decision signal based on the plurality of preliminary decision signals.

3. The detection circuit of claim 1, wherein:
the first Viterbi detector is configured to generate a first preliminary decision signal and a second preliminary decision signal, wherein the first preliminary decision signal has a longer associated depth than the second preliminary decision signal; and
the plurality of filters are configured to (i) receive first preliminary decision signal and the second preliminary decision signal and (ii) generate the final decision signal based on the first preliminary decision signal and the second preliminary decision signal.

4. The detection circuit of claim 1, wherein:
the first Viterbi detector has a first depth; and
the second Viterbi detector has a second depth.

5. The detection circuit of claim 4, wherein the first depth is longer than the second depth.

6. The detection circuit of claim 1, wherein:
the plurality of filters comprise a filter bank;
the filter bank is configured to generate the filtered signal based on the at least one preliminary decision signal; and
the second Viterbi detector is configured to generate the final decision signal based on the filtered signal.

7. The detection circuit of claim 6, wherein:
the filter bank comprises filters configured to generate a plurality of filtered signals; and
the second Viterbi detector is configured to generate the final decision signal based on the plurality of filtered signals.

8. The detection circuit of claim 7, wherein the plurality of filters are arranged in parallel relative to each other.

9. The detection circuit of claim 1, further comprising:
a first delay device configured to generate a first delay signal;
a reconstruction filter configured to generate a first reconstruction data signal based on the at least one preliminary decision signal; and
a first summer configured to generate an error signal based on (i) the first delay signal and (ii) the first reconstruction data signal.

10. The detection circuit of claim 9, wherein:
the reconstruction filter is configured to generate a second reconstruction data signal based on the at least one preliminary decision signal; and
the second Viterbi detector is configured to generate the final decision signal based on the second reconstruction data signal.

11. The detection circuit of claim 1, wherein:
the plurality of filters comprise a reconstruction filter configured to generate a reconstruction data signal based on the at least one preliminary decision signal; and
the second Viterbi detector in configured to generate a final decision signal based on the reconstruction data signal.

12. The detection circuit of claim 1, further comprising a delay circuit configured to generate a pre-filtered signal based on a reconstruction data signal, wherein the plurality of filters comprises:

a reconstruction filter configured to generate the reconstruction data signal based on the preliminary decision signal; and a filter bank configured to generate the filtered signal based on the pre-filtered signal.

13. A detection circuit comprising:
a first Viterbi detector configured to output at least one preliminary decision signal; and
a second Viterbi detector (i) arranged in series with the first Viterbi detector and (ii) configured to generate a final decision signal, wherein the second Viterbi detector is configured to generate the final decision signal based on (i) an input data signal and (ii) the at least one preliminary decision signal;
a first delay device configured to generate a first delay signal;
a reconstruction filter configured to generate a first reconstruction data signal based on the at least one preliminary decision signal;
a first summer configured to generate an error signal based on (i) the first delay signal and (ii) the at least one preliminary decision signal;
a second delay device configured to generate a second delay signal based on the first delay signal; and
a second summer configured to generate a pre-filtered signal based on (i) the second delay signal and (ii) the first reconstruction data signal,
wherein the second Viterbi detector is configured to generate the final decision signal based on (i) the second delay signal and (ii) the pre-filtered signal.

14. The detection circuit of claim 13, further comprising:
a third delay device configured to generate a third delay signal based on the second delay signal;
a filter bank configured to generate at least one filtered signal based on the pre-filtered signal; and
a third summer configured to generate a pre-finalized decision signal based on (i) the third delay signal and (ii) the at least one filtered signal,
wherein the second Viterbi detector is configured to generate the final decision signal based on the pre-finalized decision signal.

15. A detection circuit comprising:
a plurality of filters configured to generate (i) an equalized signal based on an input signal and (ii) a filtered signal; and
a detector module comprising a plurality of Viterbi detectors (i) arranged in series and (ii), configured to generate a final decision signal including final non-return-to-zero estimates,
wherein the detector module is configured to generate the final decision signal based on a pre-finalized decision signal fed forward to one of the plurality of Viterbi detectors, wherein the pre-finalized decision signal is equal to a sum of (i) a delayed version of the equalized signal and (ii) the filtered signal.

16. The detection circuit of claim 15, further comprising at least one feedback loop configured to receive an error signal from the detector module.

17. The detection circuit of claim 16, wherein the detector module is configured to generate the final decision signal based on the error signal.

18. The detection circuit of claim 16, wherein the at least one feedback loop comprises at least one of a timing loop, a gain loop, a filter loop, or a baseline loop.

19. The detection circuit of claim 16, wherein the at least one feedback loop comprises a timing loop, a gain loop, a filter loop, and a baseline loop.

20. The detection circuit of claim 16, wherein:
the at least one feedback loop comprises a timing loop;
the timing loop is configured to generate a timing signal based on the error signal; and
the plurality of Viterbi detectors are configured to generate the finalized decision signal based on the timing signal.

21. The detection circuit of claim 16, wherein:
the at least one feedback loop comprises a gain loop;
the gain loop is configured to generate a gain signal based on the error signal; and
the plurality of Viterbi detectors configured to generate the finalized decision signal based on the gain signal.

22. The detection circuit of claim 16, wherein:
the at least one feedback loop comprises a filter loop;
the filter loop is configured to generate a weight signal based on the error signal; and
the plurality of Viterbi detectors is configured to generate the finalized decision signal based on the weight signal.

23. The detection circuit of claim 16, wherein:
the at least one feedback loop comprises a baseline loop;
the baseline loop is configured to generate a correction signal based on the error signal; and
the plurality of Viterbi detectors is configured to generate the finalized decision signal based on the correction signal.

24. The detection circuit of claim 15, wherein the plurality of Viterbi detectors comprise:
a first Viterbi detector configured to generate at least one preliminary decision signal preliminary non-return-to-zero data estimates; and
a second Viterbi detector configured to generate the final decision signal based on the at least one preliminary decision signal, wherein the one of the plurality of Viterbi detectors is the second Viterbi detector.

25. The detection circuit of claim 24, further comprising:
a reconstruction filter configured to generate an error signal based on the at least one preliminary decision signal;
at least one feedback loop configured to generate a compensation signal based on the error signal; and
a response filter configured to generate the equalized signal based on (i) an input signal and (ii) the compensation signal.

26. The detection circuit of claim 15, wherein the plurality of Viterbi detectors comprise:
a first Viterbi detector configured to (i) receive the equalized signal and (ii) generate a preliminary decision signal including preliminary non-return-to-zero data estimates based on the equalized signal; and
a second Viterbi detector configured to generate final decision signal based on a sum of (i) a delayed version of the equalized signal and (ii) the filtered signal.

27. The detection circuit of claim 26, further comprising:
a reconstruction filter configured to generate a reconstruction data signal based on the preliminary decision signal;
a summing device configured to generate a prefilter signal based on the reconstruction data signal and a delayed version of the equalized signal; and
a filter bank configured to generate the filtered signal based on the prefiltered signal.

28. A method of operating a read channel decoder, the method comprising:
generating an equalized signal based on an input data signal;
generating at least one preliminary decision signal including preliminary non-return-to-zero data estimates via a first Viterbi detector and based on the equalized signal;

via a plurality of filters, (i) receiving the at least one preliminary decision signal and (ii) generating a filtered signal based on the at least one preliminary decision signal; and via a second Viterbi detector, generating a final decision signal including final non-return-to-zero data estimates based on a sum of (i) a delayed version of the equalized signal and (ii) a filtered signal.

29. The method of claim 28, further comprising:
generating a plurality of preliminary decision signals; and
receiving the plurality of preliminary decision signals via the plurality of filters,
wherein the final decision signal is generated based on the plurality of preliminary decision signals.

30. The method of claim 28, further comprising:
generating a first preliminary decision signal and a second preliminary decision signal, wherein the first preliminary decision signal has a longer associated depth than the second preliminary decision signal; and
via the plurality of filters
receiving the first preliminary decision signal and the second preliminary decision signal, and
generating the final decision signal based on the first preliminary decision signal and the second preliminary decision signal.

31. The method of claim 28, further comprising generating the filtered signal based on the at least one preliminary decision signal, wherein the final decision signal is generated based on the filtered signal.

32. The method of claim 31, further comprising generating a plurality of filtered signals, wherein the final decision signal is generated based on the plurality of filtered signals.

33. The method of claim 28, further comprising:
generating a first delay signal;
generating a first reconstruction data signal based on the at least one preliminary decision signal; and
generating an error signal based on (i) the first delay signal and (ii) the first reconstruction data signal.

34. The method of claim 33, further comprising generating a second reconstruction data signal based on the at least one preliminary decision signal, wherein the final decision signal is generated based on the second reconstruction data signal.

35. The method of claim 33, further comprising:
generating a second delay signal based on the first delay signal;
generating a pre-filtered signal based on (i) the second delay signal and (ii) the first reconstruction data signal; and
generating the final decision signal based on (i) the second delay signal and (ii) the pre-filtered signal.

36. The method of claim 35, further comprising:
generating a third delay signal based on the second delay signal;
generating at least one filtered signal based on the pre-filtered signal;
generating a pre-finalized decision signal based on (i) the third delay signal and (ii) the at least one filtered signal; and
generating the final decision signal based on the pre-finalized decision signal.

37. A method of operating a read channel decoder, the method comprising:
generating an equalized signal based on an input signal;
generating a filtered signal;
generating a pre-finalized decision signal by sum (i) a delayed version of the equalized signal and (ii) the filtered signal; and
generating a final decision signal including final non-return-to-zero estimates based on the pre-finalized decision signal fed forward to one of a plurality of Viterbi detectors, wherein the plurality of Viterbi detectors are serially arranged relative to each other.

38. The method of claim 37, further comprising:
receiving an error signal; and
generating the final decision signal based on the error signal.

39. The method of claim 38, further comprising generating a timing signal based on the error signal, wherein the finalized decision signal is generated based on the timing signal.

40. The method of claim 38, further comprising generating a gain signal based on the error signal, wherein the finalized decision signal is generated based on the gain signal.

41. The method of claim 38, further comprising generating a weight signal based on the error signal, wherein the finalized decision signal is generated based on the weight signal.

42. The method of claim 38, further comprising generating a correction signal based on the error signal, wherein the finalized decision signal is generated based on the correction signal.

43. The method of claim 37, further comprising:
generating a preliminary decision signal; and
generating the final decision signal based on the preliminary decision signal.

44. The method of claim 43, further comprising:
generating an error signal based on the preliminary decision signal;
generating a compensation signal based on the error signal;
generating an equalized signal based on an input signal and the compensation signal; and
generating the final decision signal based on the equalized signal.

* * * * *